United States Patent
Kahle et al.

(10) Patent No.: US 9,879,994 B2
(45) Date of Patent: Jan. 30, 2018

(54) METHOD OF PLACING A TOTAL STATION IN A BUILDING

(75) Inventors: Kent Kahle, Hayward, CA (US); Pat Bohle, Centerville, OH (US)

(73) Assignee: Trimble Inc., Sunnyvale, CA (US)

( * ) Notice: Subject to any disclaimer, the term of this patent is extended or adjusted under 35 U.S.C. 154(b) by 140 days.

(21) Appl. No.: 13/160,627

(22) Filed: Jun. 15, 2011

(65) Prior Publication Data

US 2012/0323534 A1    Dec. 20, 2012

(51) Int. Cl.
  *G06F 17/50* (2006.01)
  *G01C 15/00* (2006.01)

(52) U.S. Cl.
  CPC .......... *G01C 15/00* (2013.01); *G06F 17/5004* (2013.01)

(58) Field of Classification Search
  USPC ....................................................... 703/10, 5
  See application file for complete search history.

(56) References Cited

U.S. PATENT DOCUMENTS

| | | | |
|---|---|---|---|
| 5,100,229 A | | 3/1992 | Lundberg et al. |
| 5,646,844 A | | 7/1997 | Gudat et al. |
| 6,034,722 A | * | 3/2000 | Viney ...................... G01C 1/04 |
| | | | 348/135 |
| 6,035,254 A | * | 3/2000 | Nichols .......................... 701/469 |
| 6,882,315 B2 | * | 4/2005 | Richley ................. G01S 5/0226 |
| | | | 342/387 |
| 7,098,915 B2 | * | 8/2006 | Appolloni ............... G06T 15/06 |
| | | | 342/453 |
| 7,110,102 B2 | | 9/2006 | Ohtomo et al. |
| 7,211,980 B1 | * | 5/2007 | Bruemmer et al. .......... 318/587 |
| 7,411,587 B2 | | 8/2008 | Lee et al. |
| 7,511,662 B2 | | 3/2009 | Mathews et al. |

(Continued)

OTHER PUBLICATIONS

Kirschner et al. (The Kinematic Potential of Modern Tracking Total Stations—A State of the Art Report on the Leica TPS1200+, 1st International Conference on Machine Control & Guidance 2008).*

(Continued)

*Primary Examiner* — Omar Fernandez Rivas
*Assistant Examiner* — Iftekhar Khan
(74) *Attorney, Agent, or Firm* — Kilpatrick Townsend & Stockton LLP

(57) ABSTRACT

A method for locating a position determining device in an interior construction site of a building to provide line-of-sight access to a plurality of construction points in the interior construction site, includes accessing a three-dimensional model of the site by a computer system, the model including coordinates of construction points in the site to be located with a position determining device. The method further includes determining a location for placing a position determining device by the computer system, in which no obstructions at the site preclude line-of-sight access by the position determining device to the plurality of construction points. The method may further include receiving spatial data by the computer system, and deriving the three dimensional model by the computer system based upon the spatial data. The position determining device may comprise a robotic total station or other such device. The method is implemented on a computer system. A non-transitory computer-readable storage medium has computer-readable instructions embodied thereon which, when executed, cause the computer system to implement the method.

19 Claims, 8 Drawing Sheets

(56) References Cited

U.S. PATENT DOCUMENTS

| | | | |
|---|---|---|---|
| 7,679,727 B2* | 3/2010 | Benz | G01C 15/002 356/4.01 |
| 7,720,703 B1 | 5/2010 | Broughton | |
| 8,229,163 B2* | 7/2012 | Coleman | G06K 9/00208 382/103 |
| 8,279,412 B2* | 10/2012 | Motzer | G01C 21/16 356/3.01 |
| 9,182,229 B2* | 11/2015 | Grasser | G01C 15/00 |
| 2002/0111739 A1 | 8/2002 | Jandrell | |
| 2002/0128918 A1 | 9/2002 | Chao et al. | |
| 2002/0154294 A1 | 10/2002 | Hedges et al. | |
| 2002/0169550 A1 | 11/2002 | Perlmutter | |
| 2003/0128158 A1 | 7/2003 | Jandrell | |
| 2004/0012524 A1* | 1/2004 | Couronne | G01S 5/14 342/387 |
| 2004/0257275 A1 | 12/2004 | Yee et al. | |
| 2005/0228613 A1 | 10/2005 | Fullerton et al. | |
| 2006/0129320 A1 | 7/2006 | Lee et al. | |
| 2006/0236746 A1 | 10/2006 | Lippuner | |
| 2007/0052950 A1 | 3/2007 | Taylor et al. | |
| 2007/0124217 A1 | 5/2007 | Terry et al. | |
| 2007/0257831 A1 | 11/2007 | Mathews et al. | |
| 2008/0049012 A1* | 2/2008 | Bar-Joseph | G06T 19/00 345/419 |
| 2008/0204699 A1* | 8/2008 | Benz | G01C 15/002 356/4.01 |
| 2009/0256750 A1 | 10/2009 | Mathews et al. | |
| 2010/0026551 A1 | 2/2010 | Szwilski et al. | |
| 2010/0110071 A1* | 5/2010 | Elsberg et al. | 345/419 |
| 2010/0123892 A1* | 5/2010 | Miller | G01C 15/002 356/4.01 |
| 2011/0095763 A1 | 4/2011 | Linscott et al. | |
| 2011/0109915 A1* | 5/2011 | Buehlmann | G01C 15/002 356/614 |
| 2011/0149266 A1* | 6/2011 | Motzer et al. | 356/4.01 |
| 2011/0169826 A1* | 7/2011 | Elsberg | G06T 15/005 345/419 |
| 2012/0150573 A1* | 6/2012 | Soubra | 705/7.11 |
| 2012/0169530 A1* | 7/2012 | Padmanabhan | G01C 15/00 342/146 |

OTHER PUBLICATIONS

Lemmon, T. et al., "Trimble Integrated Surveying Techniques", http://tri.trimble.com/docushare/dsweb/Get/Document-239290/022543-133_Integrated_Surveying_WP_0605.pdf, 2005, 7 pages.

"Trimble New AllTrack System Manages Construction Asset Usage and Reduces Loss", Sunnyvale, California, http://www10.giscafe.com/nbc/articles/view_article.php?articleid=731463, http://article.wn.com/view/2009/08/24/Trimbles_New_AllTrac_System_Manages_Construction_Asset_Usage_9/, http://investor.trimble.com/releasedetail.cfm?ReleaseID=404541, Aug. 2009.

Trimble, "TerraSync Software, Getting Started Guide", Version 3-30, A, Dec. 2008 http://bss.sfsu.edu/jdavis/field/TerraSyncGettingStartedGuide.pdf.

Tribmle, "TerraSync Operations Guide", Version 2-40, Revision A, Sep. 2003 http://geoplane.com/downloads/Field_Software/Mapping/Geo_XMXTXH/TerraSyncOperationsGuide.pdf.

Shorter, Nicholas Sven, "Unsupervised Building Detection from Irregularly Spaced Lidar and Aerial Imagery", UMI 3383696, 2009.

Trimble, "GPS Pathfinder office Software, Getting Started Guide", Version 4, Revision A, part No. 34231-32, 2007 http://www.geoplane.com/downloads/Office_Software_Manuals/Mapping/GPS%20Pathfinder%20Office%204.0%Getting%20Started%20Guide.pdf.

ArcGis 9, "What is ArcGis 9-1", ESRI 2006 http://webhelp.esri.com/arcgisdesktop/9/1/pdf/what_is_ArcGIS.pdf.

ArcGis 9, "Using ArcPad", ESRI 2005 http://www.geo.utexas.edu/courses/371C/Labs/Lab9/ArcPad_7_UserGuide_1105.pdf.

McHugh et al., "Evaluating Techniques for Monitoring Rock Falls and Slope Stability", Spokane Research Laboratory, National Institute for Occupational Safety and Health, Spokane, WA, 10 pages.

Trimble GNSS Infracture, "Deformation Monitoring" http://www.trimble.com/infracture/deformation_monitoring.aspx, 1 page, 2010.

"ArcGIS 3D Analyst", 1 pg., Oct. 29, 2010 http://www.esri.com/software/arcgis/extension/3danalyst/index.html.

Trimble, "Trimble RealWorks software for 3D Scanning in Surveying and Spatial Imaging", 1 pg., Oct. 29, 2010 http://www.trimble.com/realworks.shtml.

"GNSS torchbearers", Technology & More, pp. 6-8, 2007.

"Satellites, Dams and Earthquakes", Technology & More, pp. 16-17, 2009.

"Rapid Response", Technology & Moore, pp. 12-13, 2009.

* cited by examiner

METHOD OF PLACING A TOTAL STATION IN A BUILDING

CROSS-REFERENCE TO RELATED APPLICATIONS

None.

STATEMENT REGARDING FEDERALLY SPONSORED RESEARCH OR DEVELOPMENT

Not Applicable.

BACKGROUND

During some construction projects, such as building out the interior of a large building under construction, or renovating an older building, it is extremely useful to refer to Building Information Modeling (BIM) data. This data, when available, defines the building structure, including the interior, in three dimensions, and its use increases the productivity of construction workers by facilitating the location and placement of various building construction elements and fixtures. Typically, the BIM model of the building is maintained after the building construction is completed, and can be used over the life of the building for construction, expansion, and maintenance purposes. The BIM model defines building geometry, spatial relationships, and quantities and properties of building components.

During new construction or renovation, it is extremely useful to be able to locate quickly various construction points in three dimensions within the building interior. As the interior of a building is being finished, connectors, anchors and the like are attached to the floors, ceilings and other structures in the building, and cuts are made and holes drilled using power saws and drills. All of this must be accomplished at predetermined, precisely defined positions in the building interior. For example, nail guns, power saws, powder anchor tools, and the like are used to nail, cut, install fasteners, and perform other operations at predetermined points within the building with little error. Additionally, a large number of electrical, plumbing, and HVAC components must be properly sited and installed. The construction points for all of these building elements must be located quickly and with some precision with respect to the surrounding walls, ceilings and floors, as they are roughed in. Typically, a substantial amount of time and effort has been required to lay out the many construction points at such a construction site. Teams of workers have been needed to measure and mark predetermined locations. It will be appreciated that this process has been subject to errors, resulting from measurement mistakes and from accumulated errors. Further, the cost of this layout process and the time needed to perform the layout process have both been significant.

Layout of the construction points at a building interior construction site has been accomplished in more automated ways, such as for example by using a robotic total station device, positioned within the building. The total station is positioned at a fixed, known location and directs a beam of laser light to a desired location. The beam may illuminate a floor, ceiling or wall at a point or may be directed to, and reflected from a target, such as a retroreflective target. By measuring the time of travel of the beam from the total station to the surface or target and then back to the total station, the distance to the target is determined. The directional orientation of the beam to the target is also known. Since the dimensional coordinates of the total station are known, the dimensional coordinates of the target can easily be determined. One or more retroreflective elements may be positioned on a tool so that the position and orientation of the tool can be determined in relation to the building interior. Alternatively, the total station may simply direct a beam of visible laser light to illuminate a predetermined point on a wall, ceiling, floor or other building element where a construction operation is to be performed.

It will be appreciated, however, that a large number of construction points must typically be located within a building interior construction site. A difficulty may arise in locating the robotic total station within the interior area of the building under construction so that it has line-of-sight access to all of the construction points to be located. It is not uncommon that the user finds that a position selected for positioning the robotic total station results in some of the construction points being blocked by columns, walls, or other interior features of the building. Repeated repositioning of the robotic total station to avoid obstructions is an inconvenience, and reduces the efficiency gains that can be obtained through the use of the device in the layout process.

SUMMARY

A method for locating a position determining device in an interior construction site of a building to provide line-of-sight access to a plurality of construction points in the interior construction site, comprises accessing a three-dimensional model of the site by a computer system, the model including coordinates of construction points in the site to be located with a position determining device. The method further includes determining a location for placing a position determining device by the computer system, in which no obstructions at the site, as defined in the three-dimensional model, preclude line-of-sight access by the position determining device to the plurality of construction points. The method may further include receiving spatial data by the computer system, and deriving the three dimensional model by the computer system based upon the spatial data. The position determining device may comprise a robotic total station or other such device.

The method may further include generating a message by the computer system indicating that the robotic total station is precluded from having line-of-sight access to one or more of the plurality of construction points, and generating by the computer system a second location where a second robotic total station may be located such that line-of-sight access to each of the plurality of construction points is provided from one or both of the robotic total stations.

The method may further include generating a message by the computer system indicating that the robotic total stations are precluded from having line-of-sight access to one or more of the plurality of construction points, and generating by the computer system additional locations where additional robotic total stations may be located such that line-of-sight access to each of the plurality of construction points is provided from one or more of the robotic total stations.

A computer system for performing this method includes a memory for storing a three-dimensional model of an interior construction site of a building, and a processor, coupled to the memory. The processor is configured to perform the steps of the method, including accessing the three-dimensional model of an interior construction site, determining a location for placing a position determining device at the site, and determining a location for placing a position determining device, in which no obstructions at the site preclude line-of-sight access by the position determining device to a plurality of construction points in the interior construction site. The processor may be configured for receiving spatial data by the computer system, and deriving the three-dimensional model by the computer system based upon the spatial data.

A non-transitory computer-readable storage medium has computer-readable instructions embodied thereon which, when executed, cause a computer system to implement a method for locating a position determining device in an interior construction site of a building to provide line-of-sight access to a plurality of construction points in the interior construction site.

DETAILED DESCRIPTION

Figure 1:
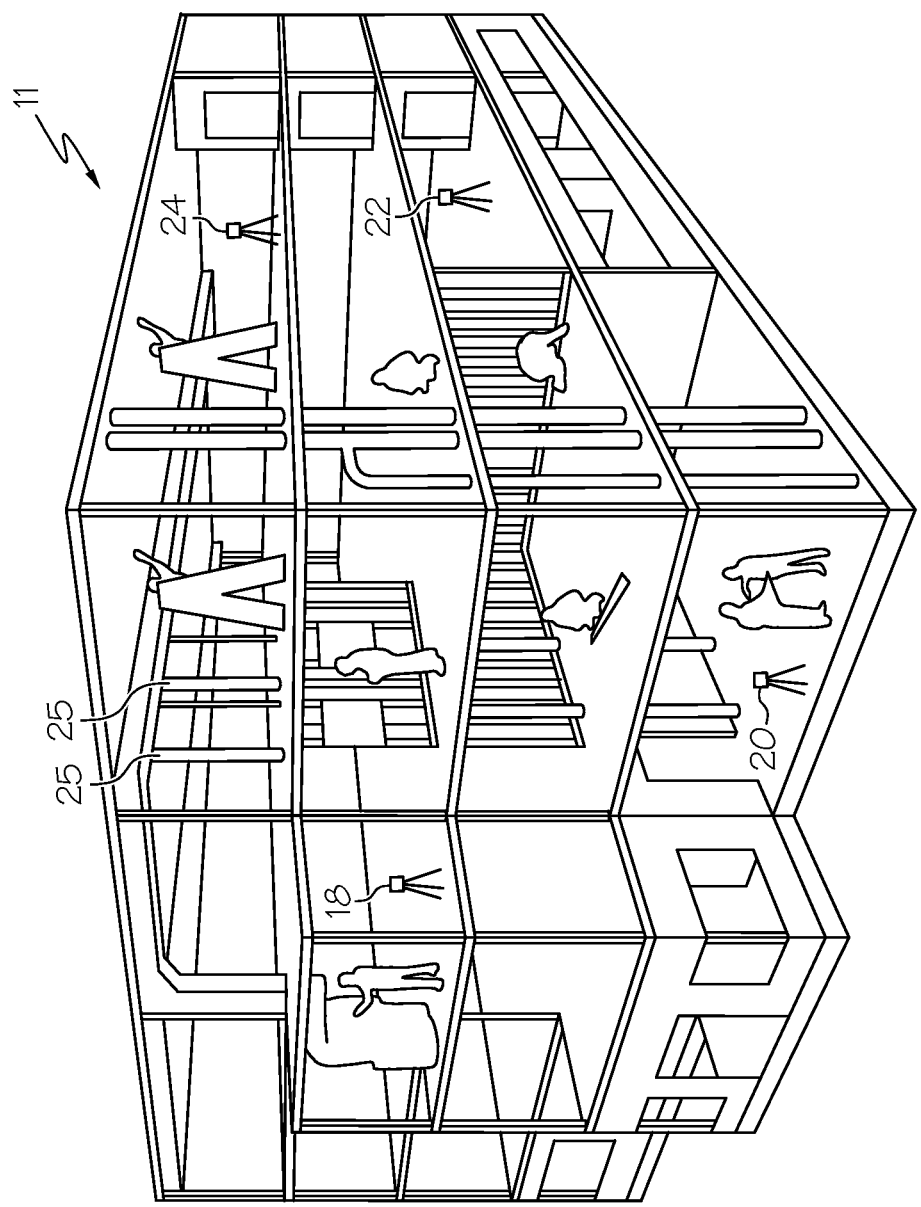
FIG. 1 is a view illustrating a building under construction.

FIG. 1 illustrates a building 11 under construction. Each floor is an interior construction site in which the various building structures, components, and fixtures must be positioned. In laying out the interior of each floor of the building, it is necessary to locate a large number of construction points where various operations are performed or building components are to be located. Power tools and hand tools are used to install fasteners, nails, and similar devices, and to cut and drill various structural components, such as the floors, walls, and ceilings of the building, at predetermined construction points. Non-power tools are also used to perform numerous functions, such as for example using a ferrous scanner to detect the positions of reinforcing bars and studs.

In the past it has been common for workers to go through a time-consuming layout process, measuring and marking various construction points where tools, such as power tools, are to be operated, before the cutting, fastening and steps are performed. This layout operation has been improved by the use of robotic total stations that are capable of projecting beams of laser light to construction points, illuminating surfaces at the construction points or illuminating retroreflective targets that can be moved about the interior construction site to the construction points. A robotic total station system will typically operate in conjunction with a data base defining a Building Information Model (BIM), which incorporates building geometry, spatial relationships, and quantities and properties of various building components. Although the following description is based on the use of one or more total stations, it should be understood that this method finds equal applicability to other types of position determining devices that require line-of-sight access to locate construction points in a building interior. For example, position determining systems are available in which a laser transmitter projects multiple, non-parallel, fan-shaped beams of laser light and rotates these beams continuously about a generally vertical access. A beam sensor which senses the illumination in succession by each of the fan shaped beams provides output signals that allow a determination to be made as to the position of the sensor with respect to the transmitter position.

FIG. 1 shows robotic total stations 18, 20, 22, and 24 positioned on the floors of the building 11 under construction. As indicated above, the robotic total stations are used to determine the coordinates of construction points that are defined by a three-dimensional database, such as a BIM model. Each total station is positioned at a predetermined point on the building level and the total station is then operated to direct its beam of laser light to illuminate a construction point or a target at the construction point. Such a robotic total station may be of the type available from Trimble Navigation Limited, which tracks one or more retroreflective targets. The total station receives the reflected light, and measures the time of flight of the beam. From this data, the robotic total station is able to calculate the three-dimensional coordinates of the target.

It will be appreciated that each level of the building includes numerous obstructions, such as columns, walls, pipes, conduits, various types of equipment, and fixtures, which will effectively block the line-of-sight access that a robotic total station requires in order to direct its beam to some areas at that level of the building. For example, columns 25 on the top level of the building will shield some areas of the top level from the reference beam of the robotic total station 24. If construction points of interest lie in those shielded areas, it may be necessary to move robotic total station 24 to a new position on the top level. This, in turn, requires that robotic total station be precisely positioned at this new position, slowing the layout process.

In the instant method, this difficulty is addressed by determining a position that provides excellent line-of-sight to construction points at the interior building construction site before the robotic total station is set up and located at the site, thereby eliminating the need to set up the total station more than once, if possible. This method contemplates locating the robotic total station in an interior construction site of a building to provide line-of-sight access to a plurality of construction points in the interior construction site by accessing a three-dimensional model of the site by a computer system. The model includes coordinates of construction points in the site to be located with a robotic total station. The method further contemplates determining a location for placing the robotic total station by the computer system, in which no obstructions at the site preclude line-of-sight access by the robotic total station to the plurality of construction points. It will be appreciated that, based on the geometry of the interior construction site and its obstructions and on the locations of the various construction points, a single location may not be available at the construction site which has line-of-sight access to all of the construction points. In such instances, the method contemplates determining a second point at which the robotic total station, or a second robotic total station, may be placed to provide access to all of the construction points. In some instances, it may be necessary to provide additional locations for the robotic total station or stations or for additional robotic total stations in order to cover all of the construction points.

Figure 2:
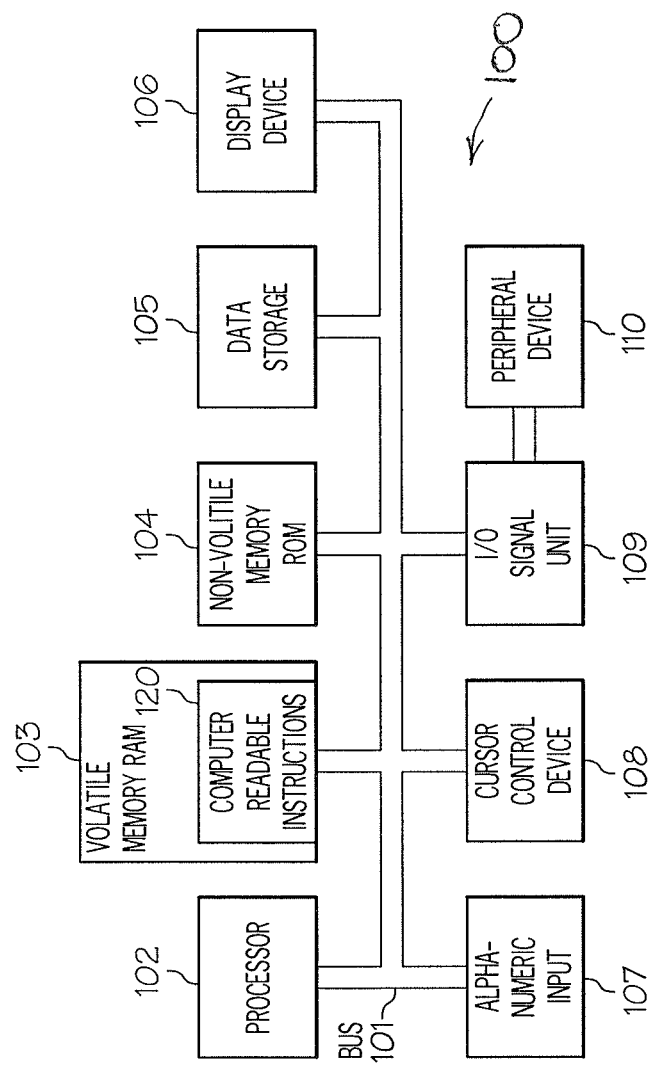
FIG. 2 is a block diagram of an example computer system used in accordance with embodiments described herein.

FIG. 2 shows a computer system 100 which can be used to practice this method. It will be appreciated that computer system 100 is presented as an example only and that embodiments can operate within a number of different computer systems, including general-purpose computer systems, embedded computer systems, laptop computer systems, hand-held computer systems, and stand-alone computer systems. The computer system 100 includes an address/data bus 101 for conveying digital information between the various components, a central processor unit (CPU) 102 for processing the digital information and instructions, a volatile main memory 103 comprised of volatile random access memory (RAM) for storing the digital information and instructions, and a non-volatile read only memory (ROM) 104 for storing information and instructions of a more permanent nature.

The method is implemented by the computer system 100 executing computer-readable instructions 120 residing in volatile main memory 103 which causes processor 102 and/or other components of computer system 100 to carry out the instructions. Alternatively, it should be noted that the computer-readable and executable instructions 120 can be stored either in volatile memory 103, data storage device 105, or in an external storage device, not shown. In addition, computer system 100 may also include a data storage device 105 (e.g., a magnetic, optical, floppy, or tape drive or the like) for storing large amounts of data. It is noted that data storage device 105 comprises or can receive a removable data storage device. Some non-limiting examples of a removable storage device include a Digital Versatile Disk (DVD) and a Compact Disk Read Only Memory (CD-ROM). It is appreciated that computer-readable and executable instructions 120 can also be stored on such removable computer-readable storage media.

Devices which are optionally coupled to computer system 100 include a display device 106 for displaying information to a computer user, an alpha-numeric input device 107, e.g., a keyboard, and a cursor control device 108, e.g., mouse, trackball, light pen, or the like, for inputting data, selections, and updates. Computer system 100 can also include a mechanism for emitting an audible signal (not shown).

Optional display device 106 may be a liquid crystal device, cathode ray tube, or other display device suitable for creating graphic images and alpha-numeric characters recognizable to a user. Optional cursor control device 108 may allow the computer user to signal the two dimensional movement of a visible symbol, such as a cursor, on a display screen of display device 106. Many implementations of cursor control device 108 are known in the art, including trackball, mouse, touch pad, joystick, or special keys on alpha-numeric input 107 capable of signaling movement of a given direction. Alternatively, a cursor may be directed or activated via input from alpha-numeric input 107, using special keys and key sequence commands. Further, the cursor may be directed or activated via input from a number of specially adapted cursor directing devices.

Additionally, computer system 100 may include an input/output (I/O) signal unit, e.g., an interface 109, for interfacing with a peripheral device 110, e.g., a computer network, modem, or mass storage device. Accordingly, computer system 100 may be coupled in a network, such as a client/server environment, whereby a number of clients, e.g., personal computers, workstations, portable computers, minicomputers, or terminals, are used to run processes for performing desired tasks.

Figure 3:
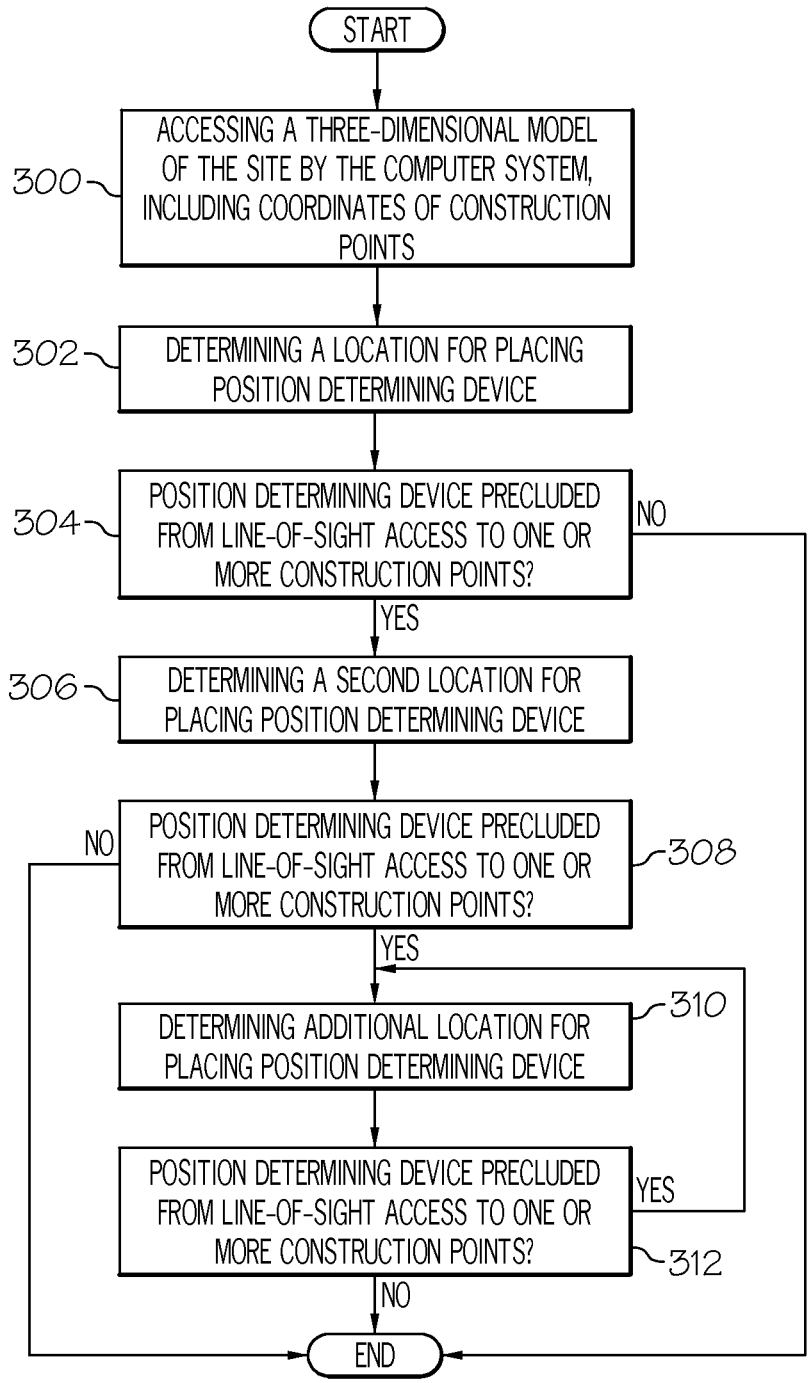
FIG. 3 is a flowchart illustrating a method in accordance with the embodiments described herein.

Reference is now made to FIG. 3, which is a flowchart illustrating a method in accordance with the embodiments described herein. This method contemplates locating a position determining device, such as for example a robotic total station, in an interior construction site of a building to provide line-of-sight access to a plurality of construction points in the interior construction site. It will be appreciated that other position determining devices may also require unobstructed access to construction points in an interior construction site, and this method may also be used to advantage with such other devices. As is indicated at 300, the initial step is one of accessing a three-dimensional model of the interior construction site by the computer system, the model including coordinates of the construction points in the site that are to be located with a position determining device. Spatial data may be received by the computer system; with the three dimensional model being derived by the computer system based upon the spatial data.

Next, as indicated at 302, a location is determined for placing the position determining device by the computer system. It is desired that there be no obstructions at the site that preclude line-of-sight access by the robotic total station to the plurality of construction points. This is checked at 304 and if there are no obstructed construction points, then the process is completed. It will be appreciated that this is a three dimensional check in which the height of any obstructions and the heights of the construction points are taken into account in determining the placement of the total station in three dimensions. If one or more of the construction points is obstructed, then a message may be generated by the computer system indicating that the position determining device is precluded from having line-of-sight access to one or more of the plurality of construction points, with this being displayed to the operator. A second location is determined at 306 for by the computer system for the placement of a position determining device. The objective is that a second position determining device can be located at the second position such that line-of-sight access to each of the plurality of construction points is provided from one or both of the position determining devices. In other words, the use of together of two robotic total stations or similar devices insures that all of the construction points can be located. This is checked at 308 and if there is access to all of the construction points using the two position determining devices, then the process is completed. If, however, there are still some construction points that are blocked by obstructions, even with the use of two position determining devices at two locations, then an additional position determining device is located at yet another location at 310. A check is made for obstructed construction points at 312, and the process is repeated until all construction points may be access on a line-of-sight basis from at least one position determining device.

This process is performed by the computer system, such as the exemplary computer system of FIG. 2, with the operation of the processor 102 performing the various steps, above, based on the three-dimensional model of the interior construction side of a building, as stored in memory. The three dimensional model will have been derived based on spatial data defining the construction site layout which is received by the computer. The operation of the processor may be controlled by a series of executable instruction that are stored in storage 120, and that may have been provided to the computer system on a non-transitory computer-readable storage medium having computer-readable instructions embodied thereon. The non-transitory computer-readable storage medium may be any such medium, such as those described previously.

Figure 4A:
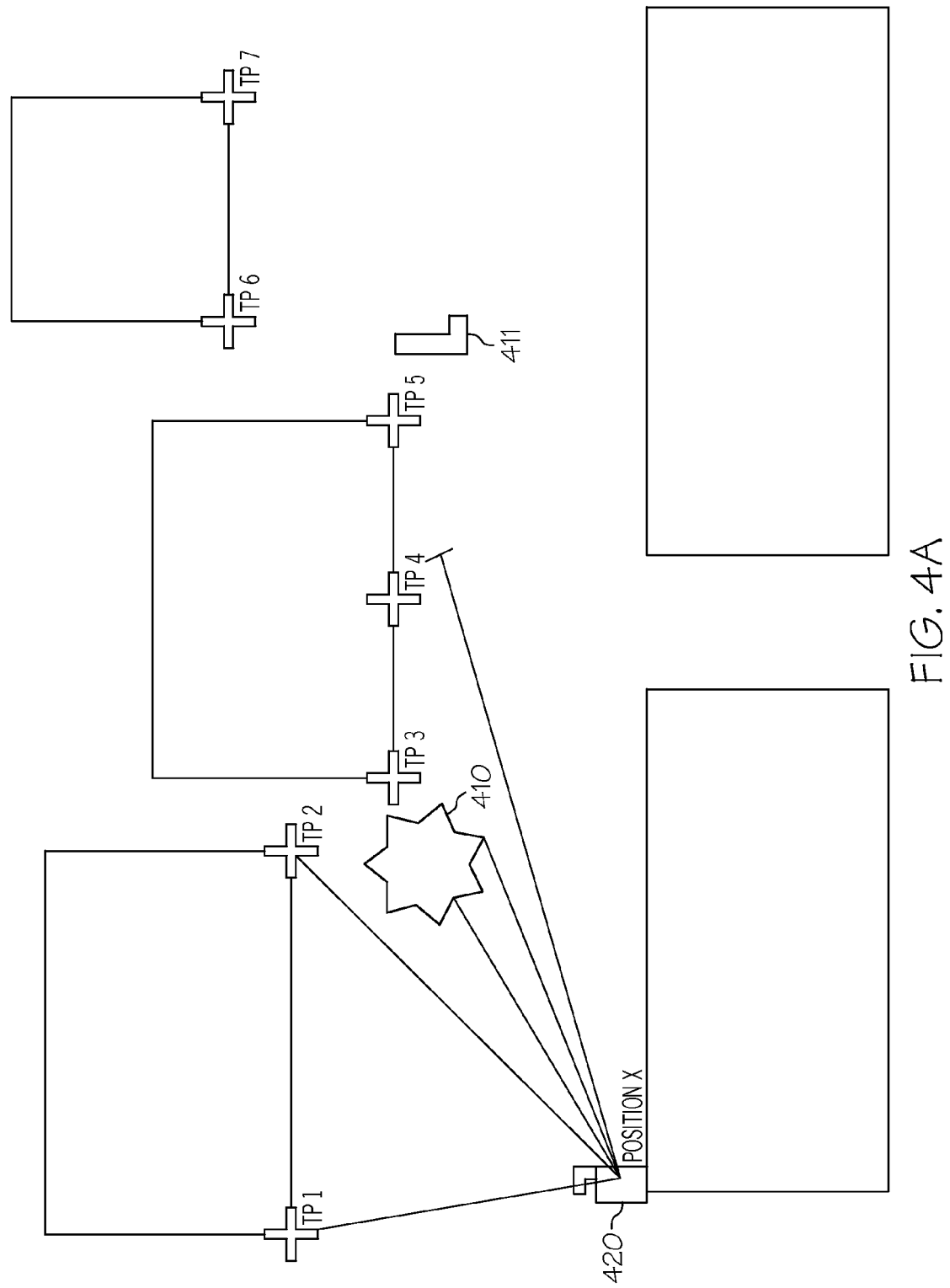
FIGS. 4A, 4B, 4C, 4D, and 4E are plan views of a building interior construction site, useful in explaining the method of FIG. 3.

Reference is now made to FIGS. 4A, 4B, 4C, 4D, and 4E are plan views of a portion of an interior building construction site. In FIG. 4A, a plurality of construction points (TPs) are to be monitored, namely TP1, TP2, TP3, TP4, TP5, TP6, AND TP7. Two potential obstructions 410 and 411 exist which could prevent the robotic total station 420 from accessing some of these construction points along line-of-sight paths. As shown in FIG. 4A, total station 420 could be placed at position X within the three-dimensional model. The field of view of total station 420 is such that its view of TP1 and TP2 is not obstructed, but the field of view between total station 420 and TP3 and TP4 is obstructed by 410. Also, it may be the case that the distances from 420 to TP5, TP6, and TP7 exceeds the range of operation of total station 420. Total stations typically have adequate range to deal operate throughout all but the largest building interiors, however.

Figure 4B:
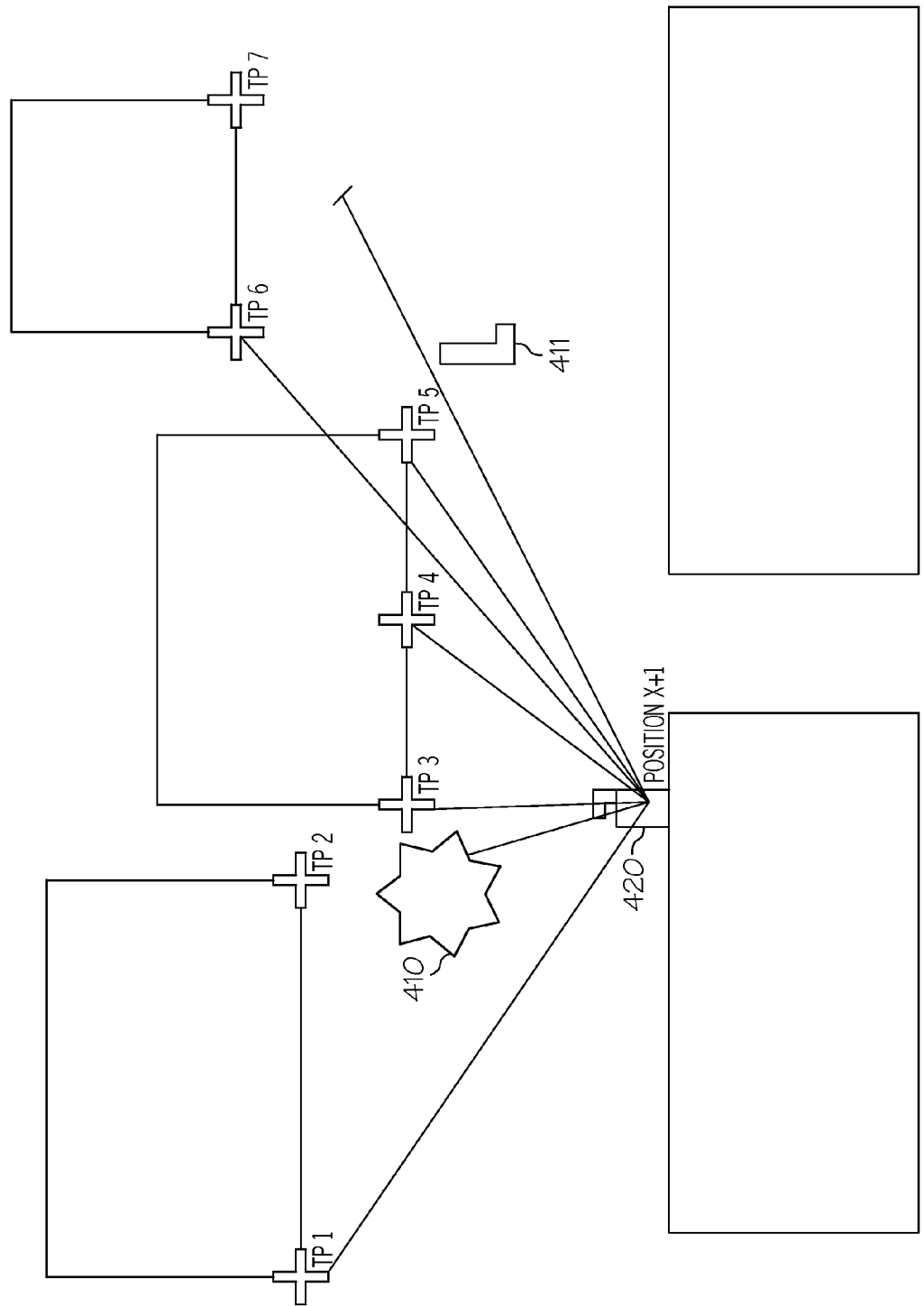

In FIG. 4B, the station 420 is shown in a second position, position X+1. The field of view from position X+1 to various construction points is illustrated. Note that the field of view to TP1 is not obstructed, but the field of view to TP2 is obstructed. Additionally, station 420 has a clear field of view of TP3, TP4, TP5 and TP6 when located at position X+1. The distance to TP7 exceeds the range of the station 420.

Figure 4C:
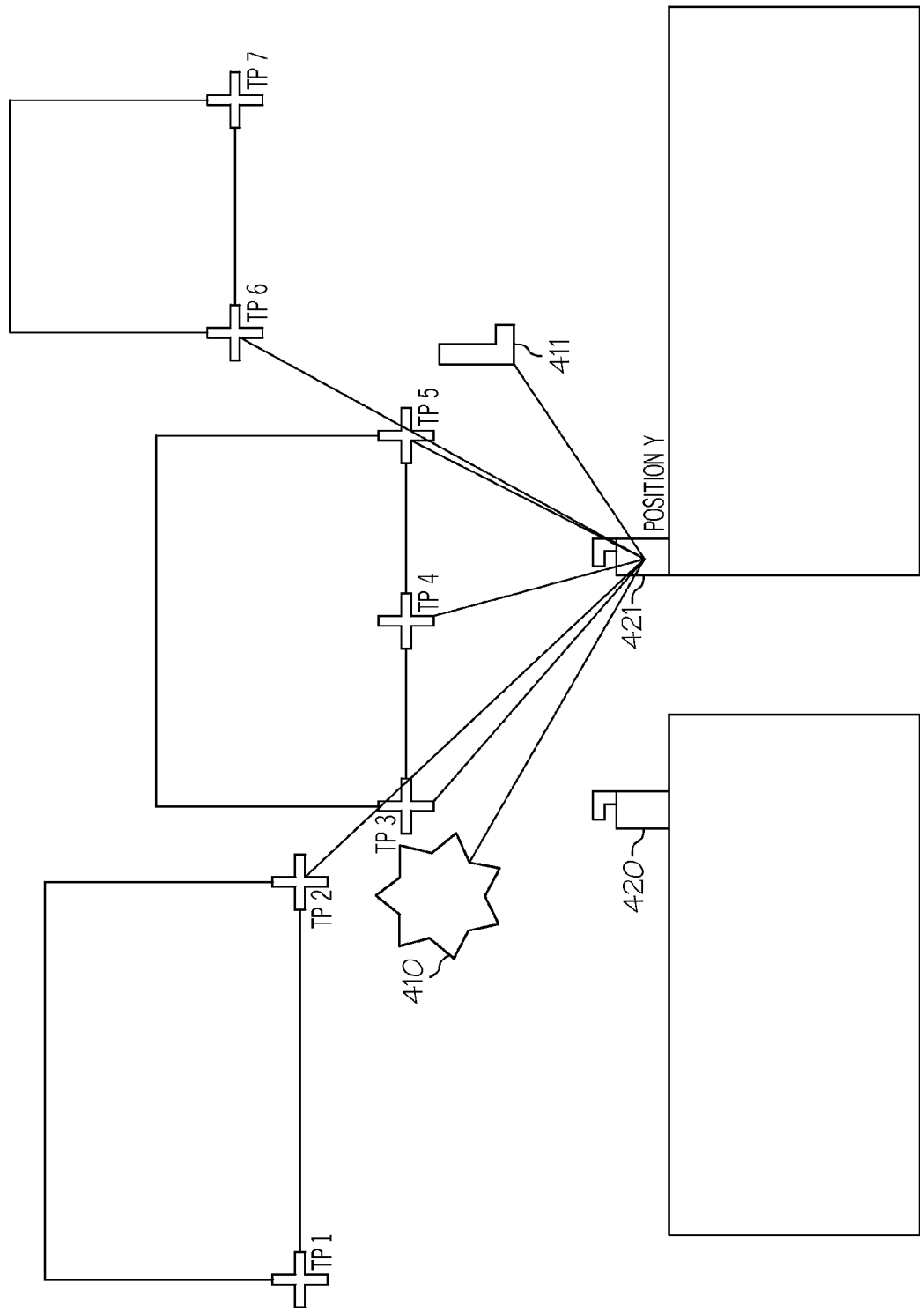

In FIG. 4C, a second robotic total station 421 is placed within the three-dimensional model at position Y. The field of view of station 421 to various construction points from position Y is such that TP1 is obstructed by 410 and TP7 is obstructed by 411. However, total station 421 has a clear field of view to TP2, TP3, TP4, TP5, and TP6.

Figure 4D:
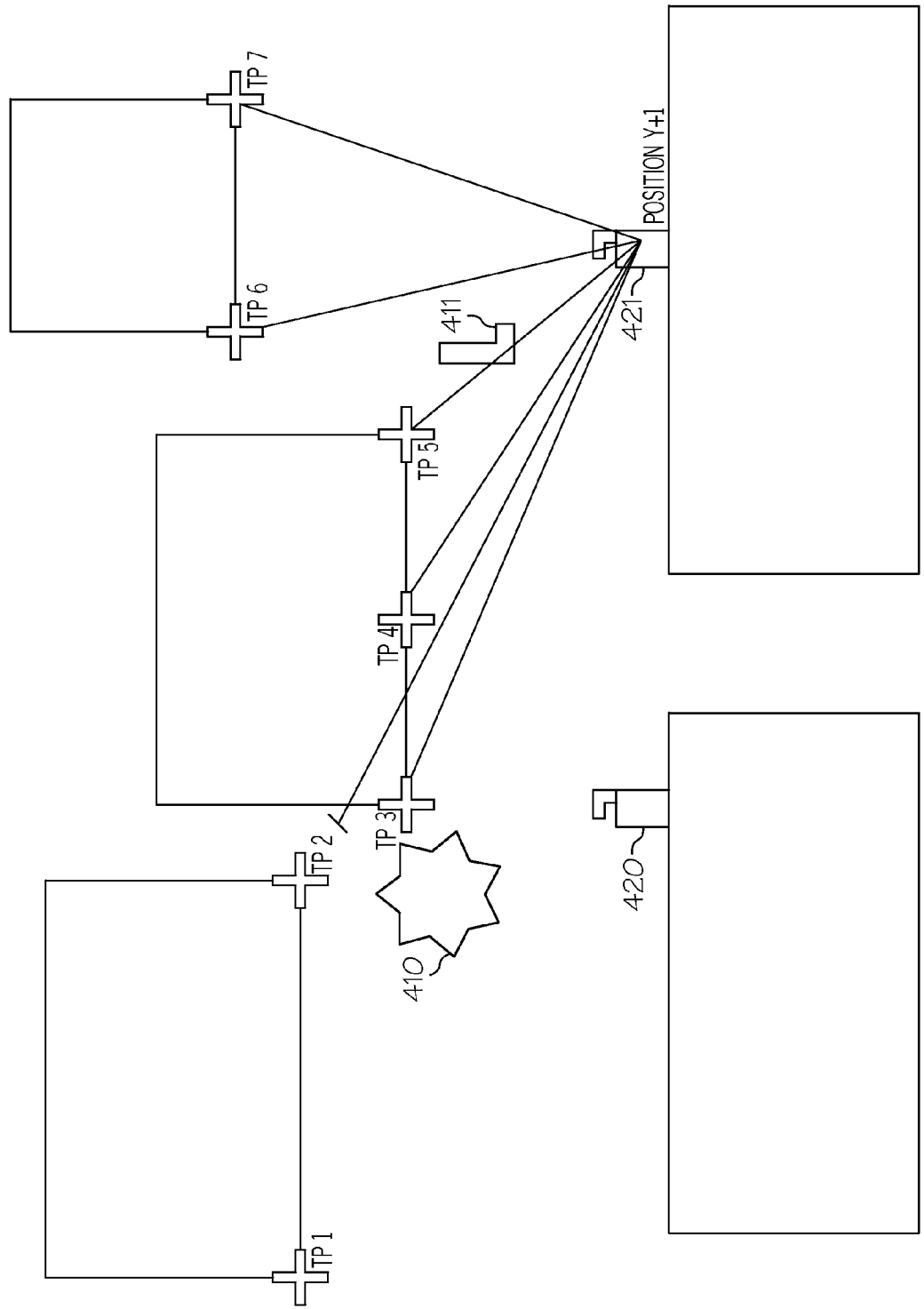

In FIG. 4D, the second robotic total station is moved to a second position Y+1. The field of view from station 421 at position Y+1 is clear to TP3, TP4, TP5, TP6, and TP7. However, the field of view to TP1 and TP2 exceeds the range of the station 421, and the line-of-sight to TP1 is obstructed by 410, in any event.

Figure 4E:
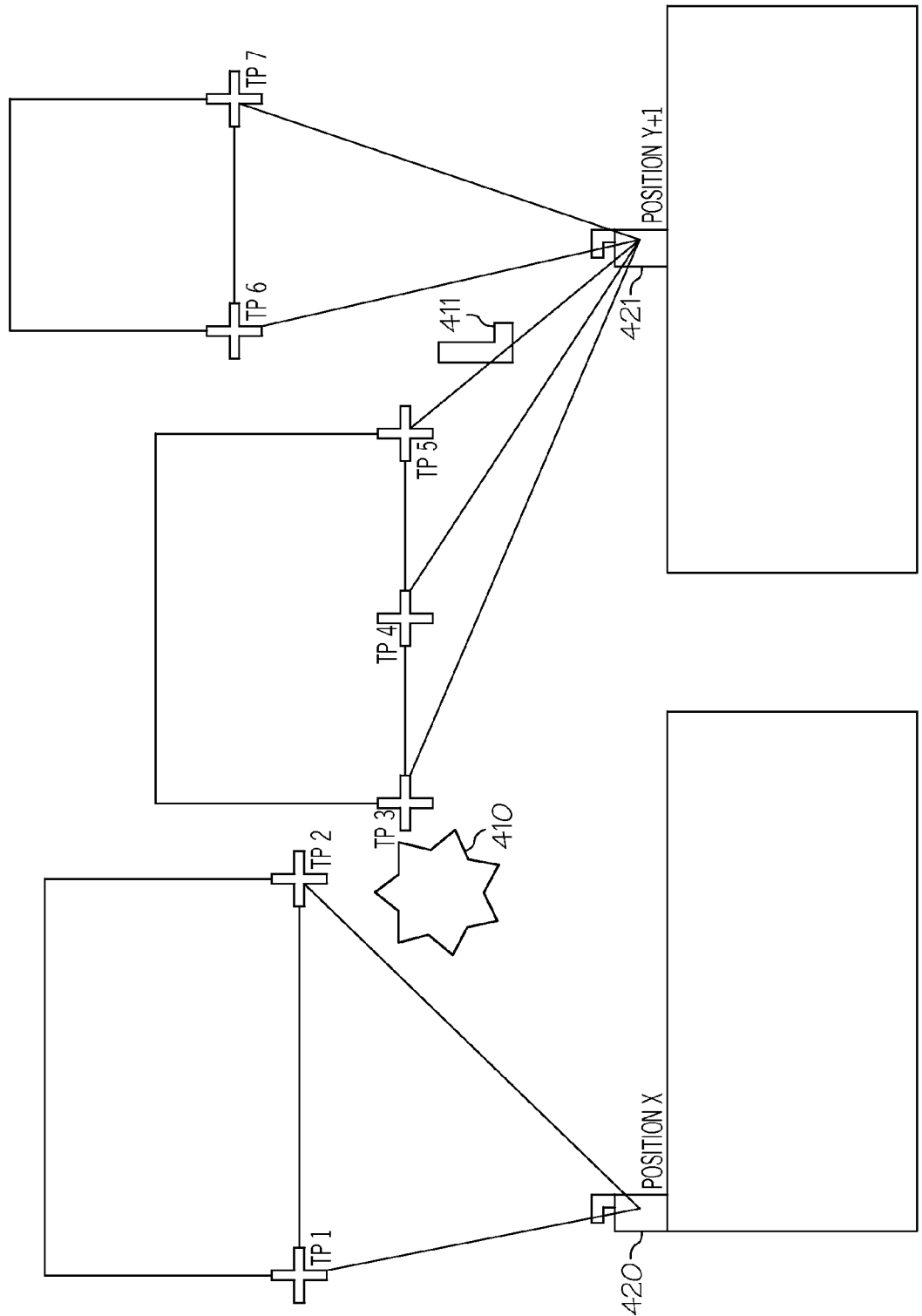

FIG. 4E illustrates positioning station 420 at position X and station 421 at position Y+1. This arrangement permits the system to locate all of the construction points with one or both of the stations 420 and 421. The system may then assign position X as the position for station 420 and position Y+1 as the position for station 421. If none of the possible combinations of positions for two robotic total stations provide adequate coverage of the site, the system will add additional locations until the specified level of coverage of construction points at the site is achieved. It will be appreciated that more than one possible location for the robotic total station or stations may provide acceptable coverage of the building interior construction site. In such cases, the system may suggest one or more locations based on various criteria, and permit the operator to shift locations, as needed. It is noted that the representation of the field of view of the robotic total stations within the three-dimensional model can be considered as spheres (e.g., range and field of view) when determining the positions for placing robotic total stations. The two dimensional representations of FIGS. 4A-4E have been presented for ease of understanding.

Other arrangements can be used to determine the position of construction points in a building interior construction site. For example, ranging radio systems that require somewhat unobstructed, line-of-sight access to construction points may be used. Other variations in the system disclosed herein may also be made. For example, the computer system may provide an indication to the total station for display as to the specific construction operation which is to be performed at each construction point. The simultaneous illumination of a construction point with the total station beam and display of the task to be performed at that construction point will facilitate the process of locating and marking a large number of points within a room or other area in the building interior.

What is claimed is:

1. A method for locating a robotic total station in an interior construction site of a building to provide unhindered line-of-sight access from the robotic total station to at least a first portion of a plurality of predetermined construction points in the interior construction site, said plurality of predetermined construction points defining locations where construction operations are to be performed within said interior construction site, the method comprising:

accessing, by a computer system, a three-dimensional model of said interior construction site, said three-dimensional model defining spatial relationships of building components within the interior construction site;

accessing, by said computer system, coordinates of each of said plurality of predetermined construction points;

determining, by said computer system, a location for placing said robotic total station based on the spatial relationships of the building components within the interior construction site and the coordinates of said plurality of predetermined construction points, in which none of the building components within said interior construction site preclude line-of-sight access by said robotic total station from the location to each of the first portion of said plurality of predetermined construction points; and placing the robotic total station at the location.

2. The method of claim 1 further comprising:
receiving, by said computer system, spatial data; and
deriving, by said computer system, said three-dimensional model based upon said spatial data.

3. The method of claim 1 further comprising:
generating, by said computer system, a message indicating that said robotic total station is precluded from having line-of-sight access to one or more of a second portion of said plurality of predetermined construction points.

4. The method of claim 3 further comprising:
determining, by said computer system, a second location for placing a second robotic total station based on the spatial relationships of the building components within the interior construction site and the coordinates of said plurality of predetermined construction points, such that line-of-sight access to each of said plurality of predetermined construction points is provided from said robotic total station and said second robotic total station.

5. The method of claim 3, further comprising:
determining, by said computer system, one or more additional locations for placing one or more additional robotic total stations based on the spatial relationships of the building components within the interior construction site and the coordinates of said plurality of predetermined construction points, such that line-of-sight access to each of said plurality of predetermined construction points is provided from said robotic total station and said one or more additional robotic total stations.

6. A method for locating a position determining device in an interior construction site of a building to provide line-of-sight access from said position determining device to at least a first portion of a plurality of predetermined construction points in the interior construction site, comprising:

accessing a three-dimensional model of said interior construction site, said three-dimensional model defining spatial relationships of building components within the interior construction site;

accessing coordinates of each of said plurality of predetermined constructions points;

determining a location for placing said position determining device based on the spatial relationships of the building components within the interior construction site and the coordinates of said plurality of predetermined construction points, in which none of the building components within said interior construction site preclude line-of-sight access by said position determining device from the location to each of the first portion of said plurality of predetermined construction points; and placing the position determining device at the location.

7. The method of claim 6 further comprising:
receiving spatial data; and
deriving said three dimensional model based upon said spatial data.

8. The method of claim 6 further comprising:
generating a message indicating that said position determining device is precluded from having line-of-sight access to one or more of a second portion of said plurality of predetermined construction points.

9. The method of claim 8, further comprising:
determining a second location for placing a second position determining device based on the spatial relationships of the building components within the interior construction site and the coordinates of said plurality of predetermined construction points, such that line-of-sight access to each of said plurality of predetermined construction points is provided from said position determining device and said second position determining device.

10. The method of claim 8, further comprising:
determining one or more additional locations for placing one or more additional position determining devices based on the spatial relationships of the building components within the interior construction site and the coordinates of said plurality of predetermined construction points, such that line-of-sight access to each of said plurality of predetermined construction points is provided from said position determining device and said one or more additional position determining devices.

11. A system comprising:
a memory for storing a three-dimensional model of an interior construction site of a building and coordinates of a plurality of predetermined construction points;
a processor, coupled to said memory, said processor configured for:
accessing the three-dimensional model of said interior construction site, said three-dimensional model defining spatial relationships of building components within the interior construction site;
accessing the coordinates of said plurality of predetermined construction points; and
determining a location for placing said position determining device based on the spatial relationships of the building components within the interior construction site and the coordinates of said plurality of predetermined construction points, in which none of the building components within said interior construction site preclude line-of-sight access by said position determining device from the location to each of a first portion of said plurality of predetermined construction points; and
the position determining device, for placing at the location.

12. The computer system of claim 11 wherein said processor is further configured for:
receiving spatial data; and
deriving said three dimensional model based upon said spatial data.

13. The computer system of claim 11 wherein said processor is further configured for:
generating a message indicating that said position determining device is precluded from having line-of-sight access to one or more of a second portion of said plurality of predetermined construction points.

14. The computer system of claim 13 wherein said processor is further configured for:
determining a second location for placing a second position determining device based on the spatial relationships of the building components within the interior construction site and the coordinates of said plurality of predetermined construction points, such that line-of-sight access to each of said plurality of predetermined construction points is provided from said position determining device and said second position determining device.

15. A non-transitory computer-readable storage medium having computer-readable instructions embodied thereon which, when executed, cause a computer system to implement a method for locating a position determining device in an interior construction site of a building to provide line-of-sight access to at least a first portion of a plurality of predetermined construction points in the interior construction site, said method comprising:
accessing a three-dimensional model of said interior construction site, said three-dimensional model defining spatial relationships of building components within the interior construction site;
accessing coordinates of each of said plurality of predetermined constructions points;
determining a location for placing said position determining device based on the spatial relationships of the building components within the interior construction site and the coordinates of said plurality of predetermined construction points, in which none of the building components within said interior construction site preclude line-of-sight access by said position determining device from the location to each of the first portion of said plurality of predetermined construction points; and
providing an indication to the position determining device of the location.

16. The non-transitory computer-readable storage medium of claim 15, wherein said method further comprises:
receiving spatial data; and
deriving said three dimensional model based upon said spatial data.

17. The non-transitory computer-readable storage medium of claim 15 wherein said method further comprises:
generating a message indicating that said positioning determining device is precluded from having line-of-sight access to one or more of a second portion of said plurality of predetermined construction points.

18. The non-transitory computer-readable storage medium of claim 17 wherein said method further comprises:
determining a second location for placing a second position determining device based on the spatial relationships of the building components within the interior construction site and the coordinates of said plurality of predetermined construction points, such that line-of-sight access to each of said plurality of predetermined construction points is provided from said position determining device and said second position determining device.

19. The non-transitory computer-readable storage medium of claim 17 wherein said method further comprises:
determining one or more additional locations for placing one or more additional position determining devices based on the spatial relationships of the building components within the interior construction site and the coordinates of said plurality of predetermined construction points, such that line-of-sight access to each of said plurality of predetermined construction points is provided from said position determining device and said one or more additional position determining devices.

* * * * *